United States Patent [19]
Johnston

[11] Patent Number: 5,815,013
[45] Date of Patent: Sep. 29, 1998

[54] SELF BACK-BIAS COMPENSATING P-DRIVER FOR MULTIPLE VOLTAGE SWITCHING ENVIRONMENTS

[75] Inventor: Robert James Johnston, Fair Oaks, Calif.

[73] Assignee: Intel Corporation, Santa Clara, Calif.

[21] Appl. No.: 718,146

[22] Filed: Sep. 18, 1996

[51] Int. Cl.$^6$ .................................................. H03B 1/00
[52] U.S. Cl. .......................... 327/112; 326/80; 326/81; 327/535; 327/537; 327/545; 327/546
[58] Field of Search .................. 326/80, 81; 327/534–5, 327/537, 545–6, 112

[56] References Cited

U.S. PATENT DOCUMENTS

| | | | |
|---|---|---|---|
| 5,565,794 | 10/1996 | Porter | 326/81 |
| 5,574,389 | 11/1996 | Chu | 326/81 |
| 5,583,454 | 12/1996 | Hawkins et al. | 326/81 |
| 5,635,861 | 6/1997 | Chan et al. | 326/81 |

*Primary Examiner*—Margaret Rose Wambach
*Attorney, Agent, or Firm*—Raymond Werner

[57] ABSTRACT

The present invention provides an output buffer having a self back-bias compensating circuit that adapts the effective output transistor size to overcome current-reducing threshold voltage shifts caused by connection of the output n-wells to a high voltage. More particularly, this invention provides a circuit configuration in which bias level detection is used to switch in additional PFET legs under high back bias conditions. The extra driver legs are disabled under zero back bias. This compensates for the effect that different voltage switching environments have on PFET performance.

11 Claims, 5 Drawing Sheets

SELF BACK-BIAS COMPENSATING P-DRIVER FOR MULTIPLE VOLTAGE SWITCHING ENVIRONMENTS

BACKGROUND OF THE INVENTION

1. Field of the Invention

The present invention relates generally to output buffer design for semiconductor integrated circuits, and more particularly to output buffers operable at both high and low supply voltages.

2. Background

The physical dimensions of circuit elements in integrated circuits (ICs), such as microprocessors, are becoming smaller with each new generation of semiconductor manufacturing processes. Although these smaller dimensions aid in increasing the operating speed of IC's, an adverse impact of reducing dimensions is the increased sensitivity of circuit elements such as field effect transistors (FETs), and more particularly the thin gate oxides of FETs, to high electric fields. One method used to overcome this increased sensitivity is to reduce the operating voltage of an IC. However, in order to maintain compatibility with previous generations of semiconductor products, it is has been necessary to provide IC's with interface circuits that are interoperable with older generation devices which operate at higher voltages. This has resulted in the practice of designing IC's having a core which operates from a first power supply voltage, and Input/Output (I/O) circuitry, typically around the physical periphery of an IC, which operates from a higher power supply voltage.

In some cases it is desirable to be able to operate an IC having a low voltage core, in either a system with a single low voltage power supply or a system with a low voltage and a higher voltage power supply. Where only a single, low voltage supply is available, both the core circuitry of the IC and the I/O circuitry operate from that single supply voltage. When it is necessary to interface the IC having a low voltage core to higher voltage circuitry, a second, higher voltage power supply is connected to the IC.

FIG. 1(a) shows a simple CMOS output buffer designed to operate using a single voltage. A pre-driver 110 produces a p-driver gate signal 112 and an n-driver gate signal 114. PFET 116 is coupled between a power supply and pad 120. The gate of p-channel FET (PFET) 116 is coupled to p-driver gate signal 112, and the substrate terminal of PFET 116 is coupled to the power supply. An n-channel FET (NFET) 118 is coupled between pad 120 and ground. FIG. 1(b) is a cross-sectional view which particularly shows the PFET source and n-well connected to the same voltage.

In order to avoid forward biasing the p+ source/drain junctions of the PFETs in the output buffers, the n-wells in which those PFETs are formed must be electrically connected to a voltage approximately equal to, or greater than, the highest voltages that will be applied to the p+ junctions in operation. When an output buffer is used in both a low voltage and a high voltage mode (e.g., 3.3V and 5V) then at least one junction of the pull-up PFET will be connected to the high voltage. Accordingly, the n-well in which the pull-up PFET resides must also be connected to the highest voltage supply to which the pull-up PFET's junctions will be connected. FIGS. 2(a)–(b) illustrate a simple CMOS output buffer where the pull-up PFET source and its associated n-well may be connected to different power supply voltages. Although, this practice of having the n-well voltage track the highest PFET source/drain voltage has the beneficial effect of preventing forward biasing, it has the adverse effect of shifting the PFET threshold voltage such that the PFET supplies less current than is needed for charging the output node.

For example, a 5 volt tolerant CMOS output buffer fabricated in a 3.3 volt process and operated in a 5 volt environment requires an electrical coupling between the 5 volt supply and the n-well of the PFET output driver to prevent failure due to forward biasing of the PFET drain junction. This electrical coupling is typically achieved by means of a low resistance connection. However, the connection of the n-well of the PFET output driver to the 5 volt supply increases the threshold voltage, Vtp, of the pull-up PFET thus decreasing the saturation current available for a given gate-to-source voltage, Vgs.

One approach to this problem has been simply to increase the gate width of the pull-up PFET in the output buffer. Although this helps provide the current to overcome the Vtp shift (due in turn to the n-well connection to 5 volts), it creates a new problem when the IC is operated in a 3.3 volt only system. The larger gate width makes the pull-up PFET too strong in a system using 3.3 volts only, and causes signal integrity and timing problems. These new problems can be overcome by a programmable strength buffer, however, such a programmable buffer requires software that can comprehend the switching voltage environment and program the buffer accordingly. This programmable approach also requires added logic complexity and increased gate count to control multiple buffer enable signals.

What is needed is a circuit that automatically compensates for the adverse effect of increased back bias.

SUMMARY OF THE INVENTION

The present invention provides an output buffer having a self back-bias compensating circuit that adapts the effective output transistor size to overcome current-reducing threshold voltage shifts caused by connection of the output n-wells to a high voltage. More particularly, this invention provides a circuit configuration in which bias level detection is used to switch in additional current sources under high back-bias conditions. The extra driver legs are disabled under zero back bias. This compensates for the effect different voltage switching environments have on PFET performance.

DETAILED DESCRIPTION

An illustrative embodiment of the present invention is described in terms of a 5 volt tolerant output buffer that is built in a semiconductor manufacturing process designed to produce circuit elements for operation at 3.3 volts. It will be understood by those skilled in this art that the invention applies to other voltage ranges and semiconductor manufacturing processes (e.g., a 3.3 volt tolerant output buffer in a 2.5 volt process). It will be further understood that the voltage values used herein are approximate, and are intended to include a range of is voltages around the nominal voltage stated in the descriptions.

Terminology

FET, as used herein, refers to metal-oxide-semiconductor field effect transistors (MOSFETs). These transistors are also known as insulated gate field effect transistors (IGFETs).

S/D refers to the source and/or drain junctions that form two of the four terminals of a FET.

Back bias refers generally to the voltage from a p+ or n+ junction to its respective substrate. As used in the circuit examples herein, back bias is measured as the voltage, with respect to ground, of a p+ junction to the voltage, with respect to ground, of the n type substrate (typically a well) in which the p+ junction resides. Other terms having substantially the same meaning are substrate bias, substrate voltage, well bias, well voltage, reverse bias and reverse voltage.

To form a single large transistor it is often necessary to connect several smaller transistors in parallel. When a large transistor is formed in this way, the smaller individual transistors are sometimes referred to as legs.

Pad refers to a bonding pad, which in an IC is typically a metallized region of the surface used form a physical connection terminal used in communicating signals to and/or from the IC. Output buffers are typically connected to pads.

P-driver is an alternative expression used in the semiconductor industry to refer to a pull-up PFET.

Circuit Configuration

Figure 1A:
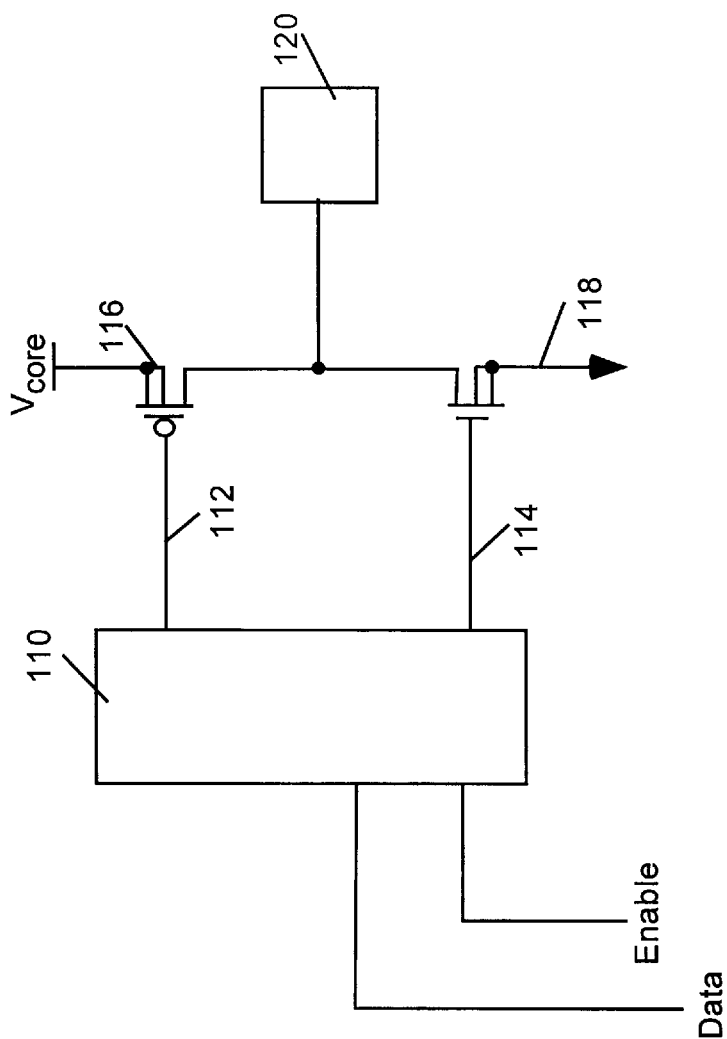
FIG. 1(a) is a schematic diagram of a simple CMOS output buffer.
Figure 1B:
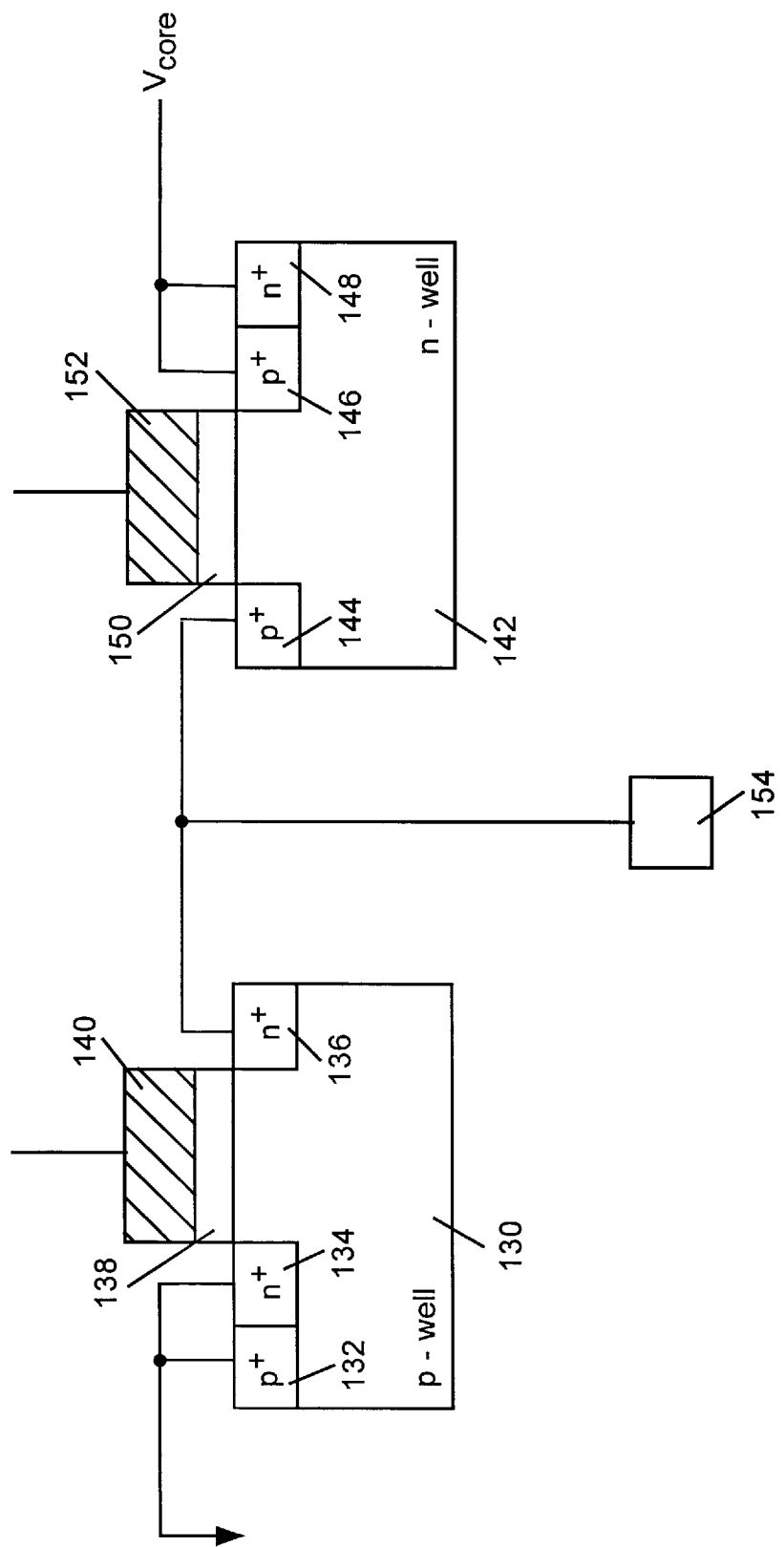
FIG. 1(b) is a cross-sectional view of the transistors of FIG. 1(a).
Figure 2A:
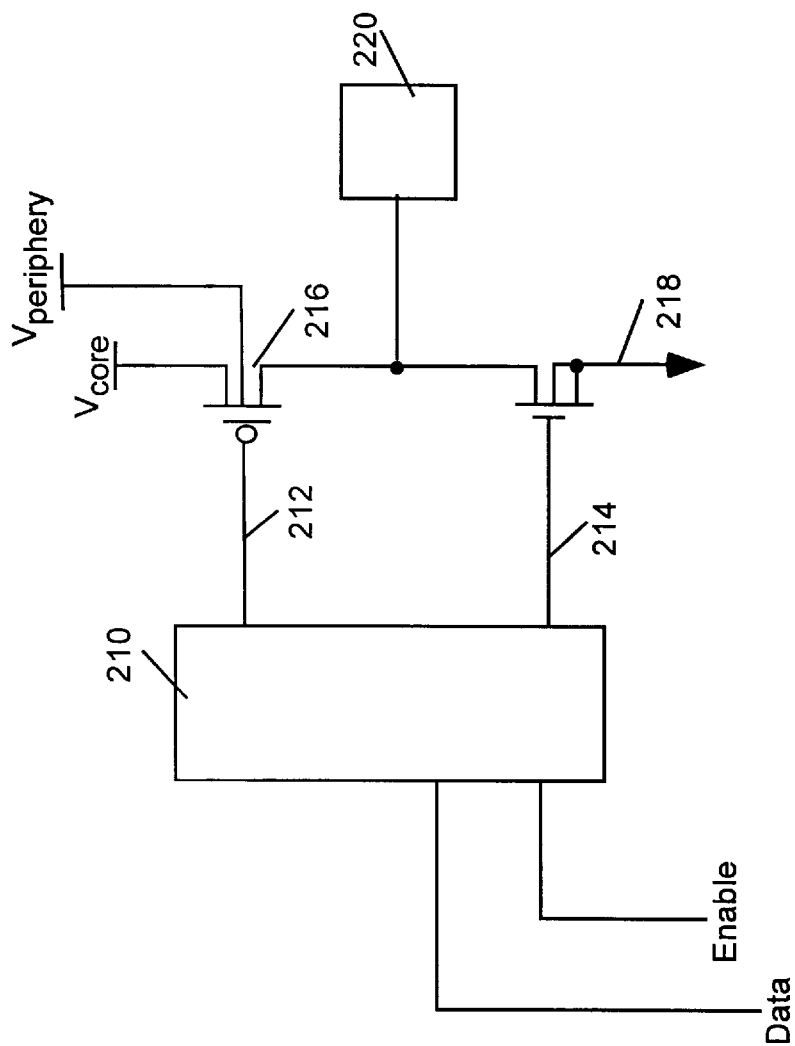
FIG. 2(a) is a schematic diagram of a simple high voltage tolerant CMOS output buffer.
Figure 2B:
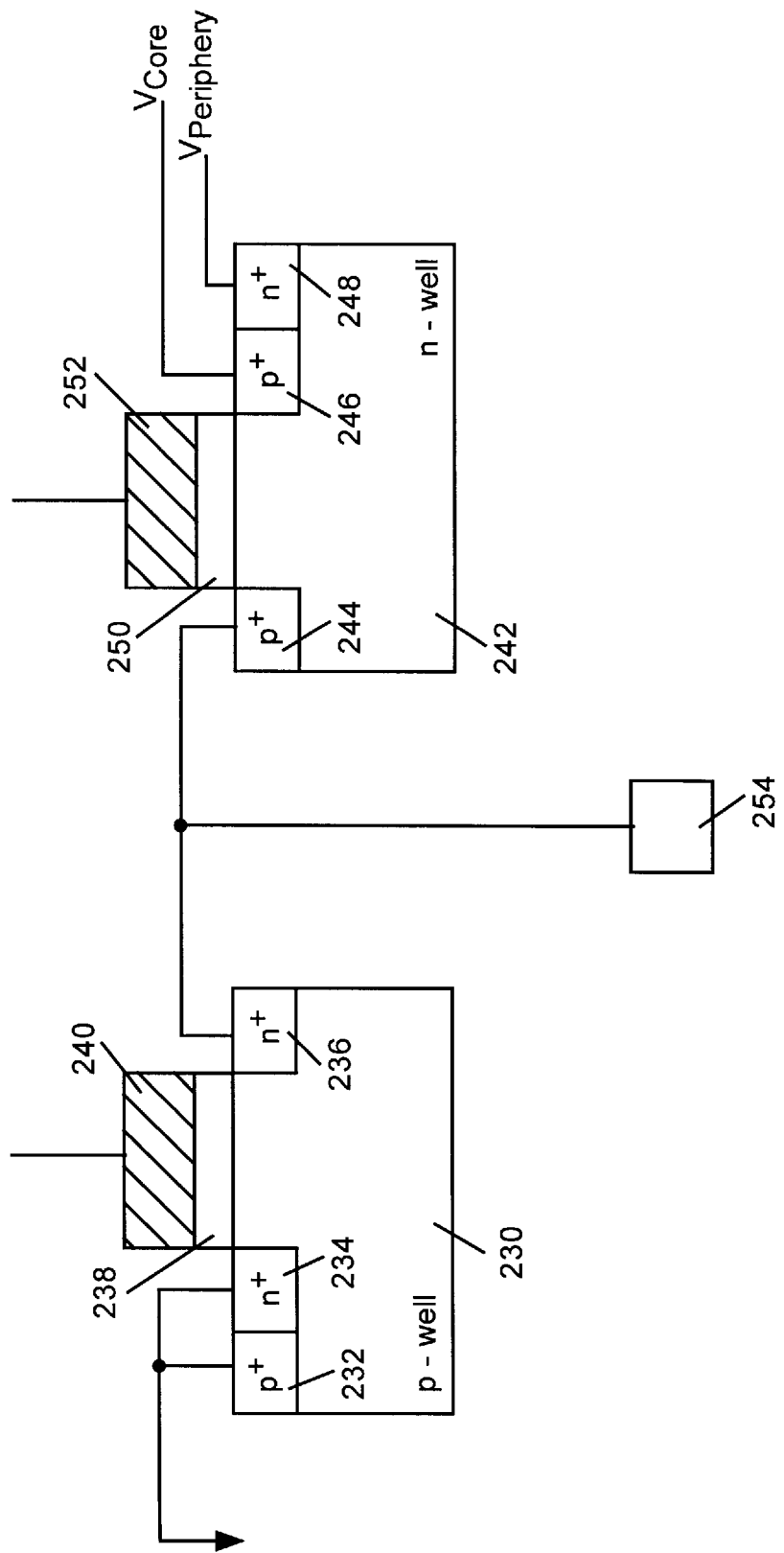
FIG. 2(b) is a cross-sectional view of the transistors of FIG. 2(a).
Figure 3:
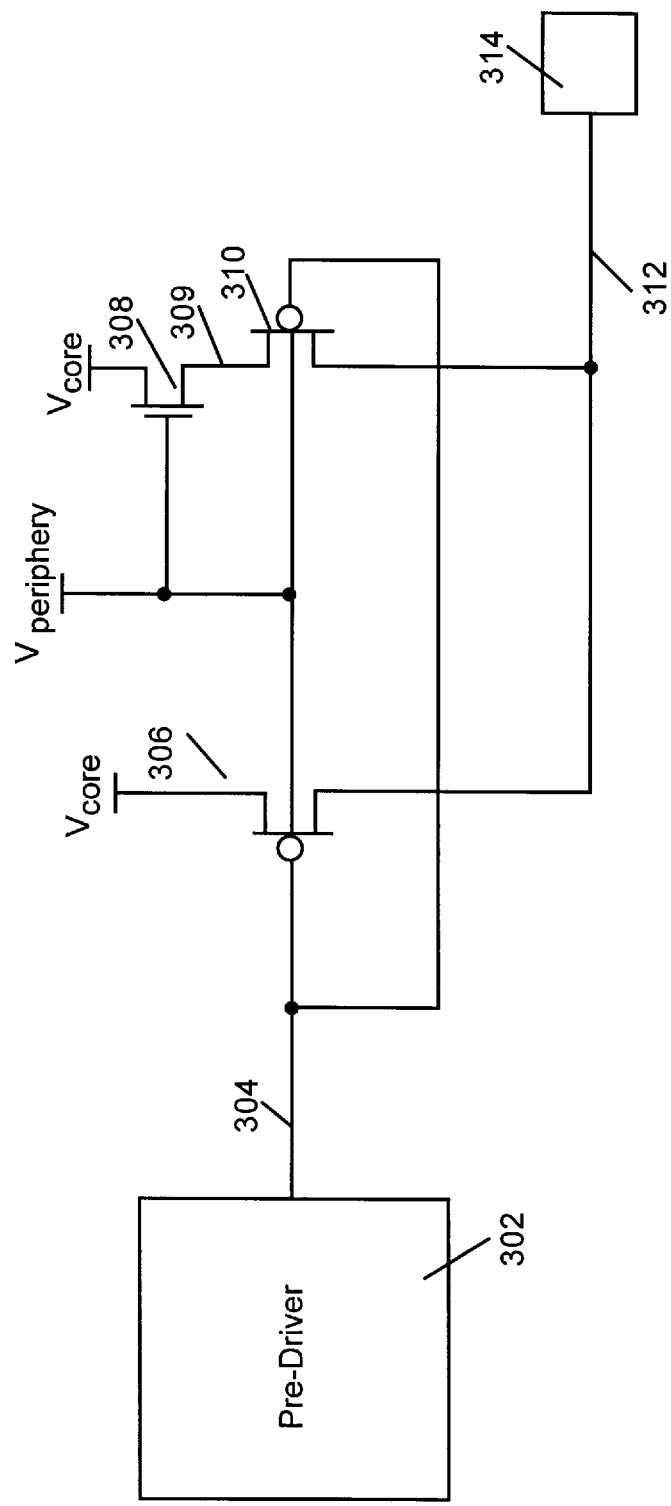
FIG. 3 is a schematic diagram of the pull-up portion of an output buffer embodying the present invention.

Referring to FIG. 3, an illustrative embodiment of the present invention is shown which has a pull-up pre-driver, two pull-up PFETs, and a pull-up NFET. A pull-up pre-driver 302 has an output node 304 coupled to the gate terminal of a first PFET 306, and also coupled to the gate terminal of a second PFET 310. PFET 306 is coupled between a first power supply voltage Vcore and output node 312. PFET 306 is typically formed from a plurality of PFET legs coupled in parallel so as to form a single transistor having a gate width substantially equal to the sum of the gate widths of the individual PFET legs. The substrate terminal of PFET 306 is tied to Vperiphery, as is the substrate terminal of PFET 310. An NFET 308 is coupled between the first power supply voltage Vcore and an intermediate node 309. The substrate terminal of NFET 308 is coupled to ground, and the gate terminal of NFET 308 is coupled to Vperiphery. PFET 310 is coupled between intermediate node 309 and output node 312. PFET 310 is typically formed from a plurality of PFET legs coupled in parallel so as to form a single transistor having a gate width substantially equal to the sum of the gate widths of the individual PFET legs. Output node 312 is typically connected to an output pad 314.

Pre-driver 302 is a logic circuit which provides the control signal needed to drive the gates of PFETs 306, 310 to either a high or low value. The gates of PFETs 306, 310 are control inputs, and are driven to a low value when output node 312 is to be charged to a high value. The gates of PFETs 306, 310 are driven to a high value if output node 312 is to be either discharged to a low value, or put into a high impedance state.

Circuit Operation

In the illustrative example, Vcore is a 3.3V power supply, and Vperiphery may be either a 5V or a 3.3V power supply. It will be understood by those skilled in the art that these are nominal power supply voltages and that variations of several per cent are typically specified for power supplies. It will also be understood by those skilled in the art that to avoid forward biasing the p+ S/D junctions of PFETs 306, 310, both of these PFETs have well voltages equal to, or greater than, their source voltages. In other words, with reference to FIG. 3, Vperiphery must be approximately equal to, or greater than Vcore. Similarly, to prevent forward biasing of the p+ junctions coupled to output node 312, Vperiphery must be approximately equal to, or greater than the highest voltage expected at output node 312.

Pull-up PFET 306 is active in both 3.3 volt and 5 volt switching environments. Pull-up PFET 306 is a current source in this circuit. Additional pull-up PFET 310, which is typically made from several legs, is controlled by NFET 308 which is connected in series between pull-up PFET 310 and the 3.3 volt power supply. As described above, the gate of NFET 308 is electrically connected to Vperiphery, that is, the same voltage used for biasing the n-wells in which PFETs 306, 308 reside. Pull-up PFET 310 together with NFET 308 also form a current source in this circuit.

In a 5 volt switching environment, Vperiphery and the gate of NFET 308 are at 5 volts. Since neither the source or drain of an NFET configured in this way can be above 3.3 volts, Vgs for NFET 308 is 1.7 volts. This means NFET 308 is turned on and can drive 3.3 volts from its drain to its source. This enables additional PFET 310 to source current to the pad.

Two changes that take place in going from a 5 volt switching environment to a 3.3 volt switching environment are that the NFET gate drive voltage and the n-well bias voltage are both reduced. In a 3.3 volt switching environment, the gate of NFET 308 is at 3.3V and this lower gate voltage means that intermediate node 309 will charge until the gate-to-source voltage of NFET 308 is approximately equal to the threshold voltage, Vtn, of NFET 308. In other words, the current available through the additional PFET 310 is reduced. This compensates for the increased current through PFET 306 which is due to shift in Vtp caused by the reduction in n-well bias.

Conclusion

The present invention provides an output buffer circuit where the performance of a high-voltage tolerant pull-up output driver is more consistent over a range of voltage switching environments. When the present invention is implemented in a CMOS semiconductor process, the output current driving the output node to a high level (Ioh) is compensated such that Ioh is substantially the same in both a low voltage and a high voltage switching environment.

An advantage of the present invention is that a single board design can be used for both a low voltage and a mixed low voltage/high voltage system (e.g., 3.3V only, and mixed 3.3V/5V).

It will be understood by those skilled in the art that the present invention, wherein output buffer driver strength is adapted as a function of the buffer switching environment may be implemented with any suitable circuit elements, in addition to the exemplary CMOS circuits described.

It will be understood that various other changes in the details, materials, and arrangements of the parts and steps which have been described and illustrated in order to explain the nature of this invention may be made by those skilled in the art without departing from the principles and scope of the invention as expressed in the subjoined claims.

What is claimed is:

1. A output buffer comprising:
    a first current source, having at least two control inputs, coupled between a first power supply and an output node; and
    a second current source, having at least two control inputs, coupled between the first power supply and the output node;

wherein the second current source provides current to the output node when the voltage of one of the two control inputs is greater than the voltage of the first power supply and, wherein the second current source comprises a PFET coupled in series with an NFET.

2. A output buffer comprising:

a first current source, having at least two control inputs, coupled between a first power supply and an output node; and a second current source, having at least two control inputs, coupled between the first power supply and the output node;

wherein the second current source provides current to the output node when the voltage of one of the two control inputs is greater than the voltage of the first power supply and, wherein the first current source comprises a first PFET, the second current source comprises a second PFET coupled in series with an NFET, and the gates of the first and second PFETs are electrically connected in common.

3. The output buffer of claim 2, wherein the substrate terminals of the first and second PFETs are electrically connected to at least one of the at least two control inputs.

4. A circuit comprising:

a first PFET coupled between a first power supply and an output node;

a first NFET coupled between the first power supply and an intermediate node;

a second PFET coupled between the intermediate node and the output node;

wherein the gate terminal of the NFET, and the substrate terminals of the first and second. PFETs, are all connected to a second power supply having a voltage approximately equal to, or greater than the voltage of the first power supply.

5. The circuit of claim 4, wherein the gate terminals of both the first PFET and the second PFET are coupled in common to a pre-driver circuit.

6. The circuit of claim 4, wherein the substrate terminal of the NFET is electrically connected to ground.

7. The circuit of claim 4, wherein the gate width of the first PFET and the gate width of the second PFET are different.

8. The circuit of claim 4, wherein the output node is coupled to a pad.

9. An output buffer circuit comprising:

a first PFET coupled source-to-drain between a first power supply node and an output node;

a second PFET coupled source-to-drain between an intermediate node and the output node;

an NFET coupled drain-to-source between the first power supply node and the intermediate node; and a pre-driver circuit having an output terminal coupled to the gates of the first and second PFETs;

wherein the substrate terminals of the first and second PFETs, and the gate of the NFET are coupled to a second power supply node.

10. The output buffer circuit of claim 9, wherein the second power supply node is configured to provide at least a first voltage and a second voltage.

11. The output buffer circuit of claim 10, wherein the first voltage is approximately equal to a voltage that the first power supply node is configured to supply.

* * * * *